(12) United States Patent
Engewald (10) Patent No.: US 11,102,903 B2
(45) Date of Patent: Aug. 24, 2021

(54) FORMED ENCLOSURE PART AND ELECTRONIC SUBASSEMBLY

(71) Applicant: ELLENBERGER & POENSGEN GMBH, Altdorf (DE)

(72) Inventor: Manuel Engewald, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 16/145,513

(22) Filed: Sep. 28, 2018

(65) Prior Publication Data
US 2019/0098787 A1   Mar. 28, 2019

(30) Foreign Application Priority Data

Sep. 28, 2017   (DE) .......................... 202017105939.1

(51) Int. Cl.
| | |
|---|---|
| H05K 7/14 | (2006.01) |
| H05K 7/12 | (2006.01) |
| H05K 3/30 | (2006.01) |
| H05K 5/00 | (2006.01) |
| H05K 5/02 | (2006.01) |

(52) U.S. Cl.
CPC .......... *H05K 7/1427* (2013.01); *H05K 3/301* (2013.01); *H05K 3/308* (2013.01); *H05K 5/0026* (2013.01); *H05K 5/0247* (2013.01); *H05K 7/12* (2013.01); *H05K 7/1417* (2013.01)

(58) Field of Classification Search
CPC .... H05K 3/301; H05K 5/0026; H05K 5/0247; H05K 7/1417; H05K 7/1427
See application file for complete search history.

(56) References Cited

U.S. PATENT DOCUMENTS

| | | | | |
|---|---|---|---|---|
| 4,362,904 A | * | 12/1982 | Schneider .............. | H05K 3/301 174/138 G |
| 4,667,270 A | | 5/1987 | Yagi | |
| 4,941,069 A | * | 7/1990 | Danenberg ............. | H05K 3/301 174/138 G |
| 5,901,045 A | * | 5/1999 | Bencivenga ......... | H05K 1/0256 361/760 |
| 6,300,564 B1 | * | 10/2001 | Moraes ................ | H05K 5/0247 174/535 |

(Continued)

FOREIGN PATENT DOCUMENTS

| | | |
|---|---|---|
| EP | 3240375 A1 | 11/2017 |
| FR | 2572618 A1 | 5/1986 |

*Primary Examiner* — Rockshana D Chowdhury
*Assistant Examiner* — Douglas R Burtner
(74) *Attorney, Agent, or Firm* — Laurence A. Greenberg; Werner H. Sterner; Ralph E. Locher (57) ABSTRACT

A formed enclosure part for mounting an electronic component on a printed circuit board includes a receiving side having an enclosure opening for receiving the electronic component in an enclosure interior, a connection side adjoining the receiving side and having connection lead-throughs for electrical connections of the electronic component, and a mounting side having a formed-on mounting profile for positioning the formed enclosure part and holding the formed enclosure part on the printed circuit board without the use of tools. An electronic subassembly, which is also provided, receives a printed circuit board and the formed enclosure part having an electronic component disposed therein.

11 Claims, 6 Drawing Sheets

(56) References Cited

U.S. PATENT DOCUMENTS

| | | | | |
|---|---|---|---|---|
| 6,677,580 B1* | 1/2004 | Sano | ................ | H01L 31/16 |
| | | | | 250/239 |
| 6,751,103 B1* | 6/2004 | Sivertsen | ............ | H05K 3/301 |
| | | | | 361/825 |
| 6,757,180 B1* | 6/2004 | Chiang | ............. | H01F 27/027 |
| | | | | 174/535 |
| 6,916,194 B2* | 7/2005 | Sichner | ............. | H01R 13/514 |
| | | | | 439/271 |
| 10,431,370 B2* | 10/2019 | Richter | ............. | H05K 13/00 |
| 2003/0171028 A1* | 9/2003 | Chang | ............. | G02B 6/4262 |
| | | | | 439/540.1 |
| 2007/0285909 A1* | 12/2007 | Bonga | ............... | H05K 3/301 |
| | | | | 361/796 |
| 2011/0038133 A1* | 2/2011 | McNamara | ......... | H05K 3/301 |
| | | | | 361/760 |
| 2011/0226524 A1* | 9/2011 | Hagiwara | .......... | H05K 5/0026 |
| | | | | 174/520 |
| 2014/0160704 A1* | 6/2014 | Janssen | ............ | H05K 7/1417 |
| | | | | 361/759 |
| 2014/0268608 A1* | 9/2014 | Haisler | ............. | H05K 3/301 |
| | | | | 361/761 |
| 2016/0133372 A1* | 5/2016 | Richter | ........... | H05K 7/20145 |
| | | | | 361/697 |
| 2016/0278213 A1* | 9/2016 | Hachiya | ............ | H05K 3/301 |
| 2016/0344119 A1* | 11/2016 | Karasik | ............. | H01R 13/719 |
| 2017/0149349 A1* | 5/2017 | Ando | ............. | H02M 3/33507 |

* cited by examiner

FORMED ENCLOSURE PART AND ELECTRONIC SUBASSEMBLY

CROSS-REFERENCE TO RELATED APPLICATION

This application claims the priority, under 35 U.S.C. § 119, of German Patent Application DE 20 2017 105 939.1, filed Sep. 28, 2017; the prior application is herewith incorporated by reference in its entirety.

BACKGROUND OF THE INVENTION

Field of the Invention

The invention relates to a formed enclosure part for mounting an electronic component on a printed circuit board, the formed enclosure part having a receiving side with an enclosure opening for receiving the electronic component in an enclosure interior. The invention additionally relates to an electronic subassembly, having a subassembly enclosure receiving a printed circuit board and the formed enclosure part with an electronic component disposed therein.

An electronic subassembly usually has a printed circuit board, on which electronic components are mounted and electrically contact each other there. The electronic components are, for example, power-electronics devices such as transistors, thyristors or, in particular, varistors. Alternatively, the electronic components are, for example, inductors or energy storage devices.

For example, the electronic components are provided with a cable lug for the purpose of electrical contacting thereof, or are screw-connected, in a comparatively awkward manner, to the printed circuit board for the purpose of mounting and for electrical contacting. In addition, for that purpose, the printed circuit board must be provided with a busbar or with a further connection part, such as a press-fitted bush, for receiving and electrically contacting a screw.

Electronic subassemblies are used, for example, in a motor vehicle, in a controller of a transmission management system, engine management system, brake management system or energy management system. Consequently, the electronic components of the subassembly are subjected to load due to shock or vibration. The electronic components are, for example, adhesive-bonded to the printed circuit board or, in particular, to the subassembly enclosure for secure and reliable fixing of the electronic components to the printed circuit board, in addition to the screwed connection. Alternatively, a lacquer or potting compound is applied, which encapsulates the electronic component. However, adhesive-bonding, potting or application of lacquer are comparatively time-consuming and expensive, in particular in the case of comparatively high piece numbers. Furthermore, the weight of the electronic subassembly is thereby increased.

SUMMARY OF THE INVENTION

It is accordingly an object of the invention to provide a formed enclosure part and an electronic subassembly, which overcome the hereinafore-mentioned disadvantages of the heretofore-known devices of this general type, with which mounting of an electronic component is as uncomplicated as possible and with which the electronic component is to be fasted as securely as possible to a printed circuit board.

With the foregoing and other objects in view there is provided, in accordance with the invention, an, in particular hollow cuboidal, formed enclosure part for mounting an electronic component, in particular a varistor (variable resistor), on a printed circuit board, including a receiving side that has an enclosure opening for receiving the electronic component into an enclosure interior. Furthermore, the formed enclosure part includes a connection side, which adjoins the receiving side and which has connection lead-throughs for the electrical connections of the electronic component, and a mounting side having a formed-on mounting profile for positioning the enclosure and holding the enclosure on the printed circuit board without the use of tools.

In other words, the electronic component is positioned and held on the printed circuit board by using the formed enclosure part. For example, the electronic component received in the formed enclosure part, and further electrical or electronic components mounted on the printed circuit board are electrically connected to each other, in a further mounting step, by soldering, in particular by wave soldering or selective soldering. In this case, the electronic component received in the formed enclosure part is preferably positioned in such a manner that the electrical contacts of the electronic component are used for contacting, or in soldering. That means, advantageously, that no further connection parts, such as a busbar, bush or cable lug, are required for the purpose of contacting.

According to an advantageous construction, the mounting profile has at least one, preferably hook-type, snap-in stud for producing a snap-in connection with a corresponding snap-in receiver of the printed circuit board. In other words, the formed enclosure part is attached to the printed circuit board without the use of tools, by the formation of a snap-in connection, and is thus held in a form-locking manner, with the snap-in stud preferably being resiliently swivelable. In this way, a comparatively uncomplicated enclosure positioning and enclosure holding of the formed enclosure part on the printed circuit board, and thus of the electronic component received in the formed enclosure part, is achieved. In particular, in this case the mounting side of the formed enclosure part forms an abutment, i.e. the mounting side of the formed enclosure part is mechanically in contact with the printed circuit board. A form-locking connection is one which connects two elements together due to the shape of the elements themselves, as opposed to a force-locking connection, which locks the elements together by force external to the elements.

According to an expedient development, the mounting profile has at least one joining stud that, in the mounted state, is received into a corresponding stud receiver of the printed circuit board. The joining stud also has a guide function in the snapping-in of the snap-in stud. In addition, the joining stud in this case advantageously improves a positioning accuracy of the formed enclosure part on the printed circuit board. In summary, the formed enclosure part is attached to the printed circuit board at least at two points, for example by using a respective joining stud and by using a snap-in stud. Due to the deformability of the snap-in stud, in particular for the purpose of producing the snap-in connection, the mounting profile preferably includes at least two joining studs, which have a comparatively high stiffness with respect to the snap-in stud. In this way, the formed enclosure part is fastened to the printed circuit board in a twist-proof and form-locking manner.

According to an expedient construction, the formed enclosure part has a (first) press lip, which is disposed in the region of the enclosure side that is opposite the connection side and that in the following is referred to as the top side, and which projects into the enclosure interior. As the electronic component is being received into the enclosure interior, this press lip is elastically tensioned toward an outer side of the enclosure, in a direction perpendicular to the connection side, in such a way that a restoring force resulting therefrom moves the received electronic component toward the connection side.

Furthermore, in an advantageous construction, the formed enclosure part is provided with a snap-in element. The latter in this case is disposed in the region of the connection side and projects into the enclosure interior. In addition, the snap-in element is resiliently swivelable in the direction of the connection side and, at its free end, has a snap-in hook for separably fixing the received electronic component. In particular, the snap-in element extends substantially perpendicularly in relation to the enclosure base, which is opposite the receiving side. In this case, with a suitable construction of the electronic component, the snap-in hook can engage behind the latter, on its side that faces toward the receiving side. The electronic component is moved against the snap-in element by using the first press lip, with the snap-in element being swiveled, in particular, in the direction of the connection side, and the snap-in hook thus being able to hold it in a form-locking manner.

Expediently, the enclosure opening is partially covered by at least one holding extension for holding the received electronic component. The holding extension in this case is disposed in an opening region of the enclosure opening that is opposite the connection side, i.e. in a region of the enclosure opening that adjoins the top side. For example, the holding extension is formed-on on the top side, and in this case preferably at the end of this side thereof that adjoins the enclosure opening, with respect to a direction perpendicular to the enclosure base, i.e. at the end of this side that is opposite the enclosure base, and extends toward the connection side. Consequently, the holding extension covers a region of the electronic component inserted in the enclosure interior, and thus the electronic component is prevented from falling out in an unwanted manner, for example as a result of load due to shock or vibration.

Preferably, in addition, the enclosure base is provided with a second press lip, which projects into the enclosure interior and which presses the electronic component in a direction perpendicular to the enclosure base, and thus onto the holding extension.

For example, on at least one of the two longitudinal sides that adjoin the receiving side and the connection side, the formed enclosure part furthermore has a respective third press lip. The latter extends into the enclosure interior, and holds the component against being moved in the enclosure interior, in a direction perpendicular to this side. In summary, the electronic component is fixed in the enclosure interior, without the use of tools, by using the first press lip and by using the second press lip, and by using the third press lip, or by using the third press lips.

According to a first variant of the formed enclosure part, the mounting side is the connection side, and at least one joining web is formed-on on the outside of the enclosure base. Furthermore, the receiving side is provided with a web receiver that is realized to receive a corresponding joining web of a further formed enclosure part. In this way, a plurality of formed enclosure parts, and thus a plurality of electronic components received therein, can be preassembled, by forming a plug-in connection, to form an enclosure packet or packet of formed enclosure parts, that can be produced without the use of tools, before mounting on the printed circuit board, in such a way that a space-saving configuration of the formed enclosure parts next to each other, and a comparatively rapid common plug-in mounting of the enclosure packet on the printed circuit board, is realized. Moreover, in the assembled state, individual formed enclosure parts of the packet of formed enclosure parts are prevented from moving in a direction perpendicular to the joining webs, and thus in this direction load due to shock or vibration is advantageously reduced.

Further, in this first variant of the formed enclosure part, the connection leadthroughs each have a hook-type extension, oriented perpendicularly in relation to the enclosure base, the hook of which forms a type of rear engagement for the electrical connection of the electronic component. For example, the electrical connections of the electronic component are realized in the form of eyelets, each of which receives an extension. Advantageously, the hook extends to the enclosure interior. Upon insertion of the electronic component, then, in particular due to the first press lip, the electronic component is pressed and preferably displaced in the direction of the connection side in such a manner that the eyelet-type electrical connection is pushed under the hook of the extension, and consequently the electrical connection, and accordingly the electronic component, is advantageously held in a form-locking manner in a direction perpendicular to the enclosure base. The electrical component in this case is moved (pressed), by using the first press lip, forming a frictional connection, against a seating that is formed onto the connection side, inside the enclosure, or preferably against the hook-type extension. Advantageously, by using the extension, the connections of the electronic component are also positioned comparatively precisely with respect to the formed enclosure part, even in the case of a comparatively large tolerance of the construction of the electronic component.

The electrical connections in this case preferably stand up on the connection side, or on the mounting side, on the outside of the enclosure. In this way, the electrical connections can be received in connection receivers of the printed circuit board and electrically contacted there, without an additional connection part, for example by (wave) soldering, to further components. In particular, following completion of soldering of the electronic component, the electrical connections of the electronic component are prevented from moving in the direction of the enclosure interior, in such a way that the electrical connections are secured against separation of the rear engagement.

According to a second variant of the formed enclosure part, the mounting side and the receiving side are opposite each other, with the connection lead through being realized as gap running perpendicularly in relation to the receiving side. Preferably, in the course of mounting, the electrical connections of the electronic component, which in this case, in particular, are realized as wire, are routed through the connection lead through and then bent in the direction of the printed circuit board, where they are, for example, soldered. In this case, in particular, the electrical component is pressed, by using the first press lip, against the seating formed onto the connection side, on the inside of the enclosure, in such a way that the electronic component is held frictionally on the inside of the enclosure.

According to an advantageous development of the second variant of the formed enclosure part, the mounting profile is realized for mounting the enclosure spaced apart from the printed circuit board. In particular, for this purpose the joining stud, or the joining studs, and the snap-in stud, or the snap-in studs, in each case have a corresponding length in the direction perpendicular to the mounting side, and in each case have an abutment such as, for example, a monolithic formed-on portion that is spaced apart from the mounting side and that stands up perpendicularly from the corresponding stud, in such a way that, in the mounted state, the abutment lies on the printed circuit board and positions the formed enclosure part spaced apart from the printed circuit board. The snap-in stud in this case is received in the snap-in receiver of the printed circuit board, forming a snap-in connection.

Particularly advantageously, in this way the formed enclosure part can cover further electronic or electrical components, in the manner of a bridge. In other words, a plurality of components is disposed over each other, in a layered manner, in a particularly space-saving manner on the printed circuit board. As a result of this, in particular the printed circuit board, or an electronic subassembly including the printed circuit board and the formed enclosure part, is realized so as to be comparatively small, i.e. space-saving and having a reduced weight. Alternatively, the formed enclosure part is disposed on the back side of the printed circuit board and uses a structural space that is already present there, with an electrical contacting of the further components already applied on the back side of the printed circuit board being covered, for example, in the manner of a bridge.

In the case of the formed enclosure part being disposed on the back side of the printed circuit board, with the electrical connections of the received electronic component being routed to the front side, and in particular provided that the further components are realized as surface-mounted devices (SMD) mounted on the front side of the printed circuit board, it is moreover advantageously possible for the electrical contacting of the further components and of the component received in the formed enclosure part to be effected in a single common soldering process.

With the objects of the invention in view, there is concomitantly provided an electronic subassembly including a subassembly enclosure, into which are inserted a printed circuit board and, mounted thereon, at least one formed enclosure part, in one of the variants described above. In other words, the formed enclosure part for mounting an electronic component on the printed circuit board has a receiving side having an enclosure opening for receiving the electronic component into an enclosure interior, and has a mounting side having a formed-on mounting profile for positioning the enclosure and holding the enclosure without the use of tools. In this case an electronic component such as, for example, a varistor, is received into the formed enclosure part. On an inner side the subassembly enclosure has an, in particular, strip-type support contour for holding the formed enclosure part. For example, the support contour is formed onto this inner side. Preferably, in this case the support contour stands up from this enclosure side and the support contour includes the formed enclosure part or, if a plurality of formed enclosure parts are disposed next to each other as an enclosure packet, includes the formed enclosure parts at the periphery, at least partially. In this way, the formed enclosure part, or the formed enclosure parts, are held securely against being moved, for example because of a vibration load or shock load on the electronic component, in addition to being held on the printed circuit board by using the support contour of the subassembly enclosure. In this way, the formed enclosure part, or the formed enclosure parts, are advantageously held in a form-locking manner.

Other features which are considered as characteristic for the invention are set forth in the appended claims.

Although the invention is illustrated and described herein as embodied in a formed enclosure part and an electronic subassembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
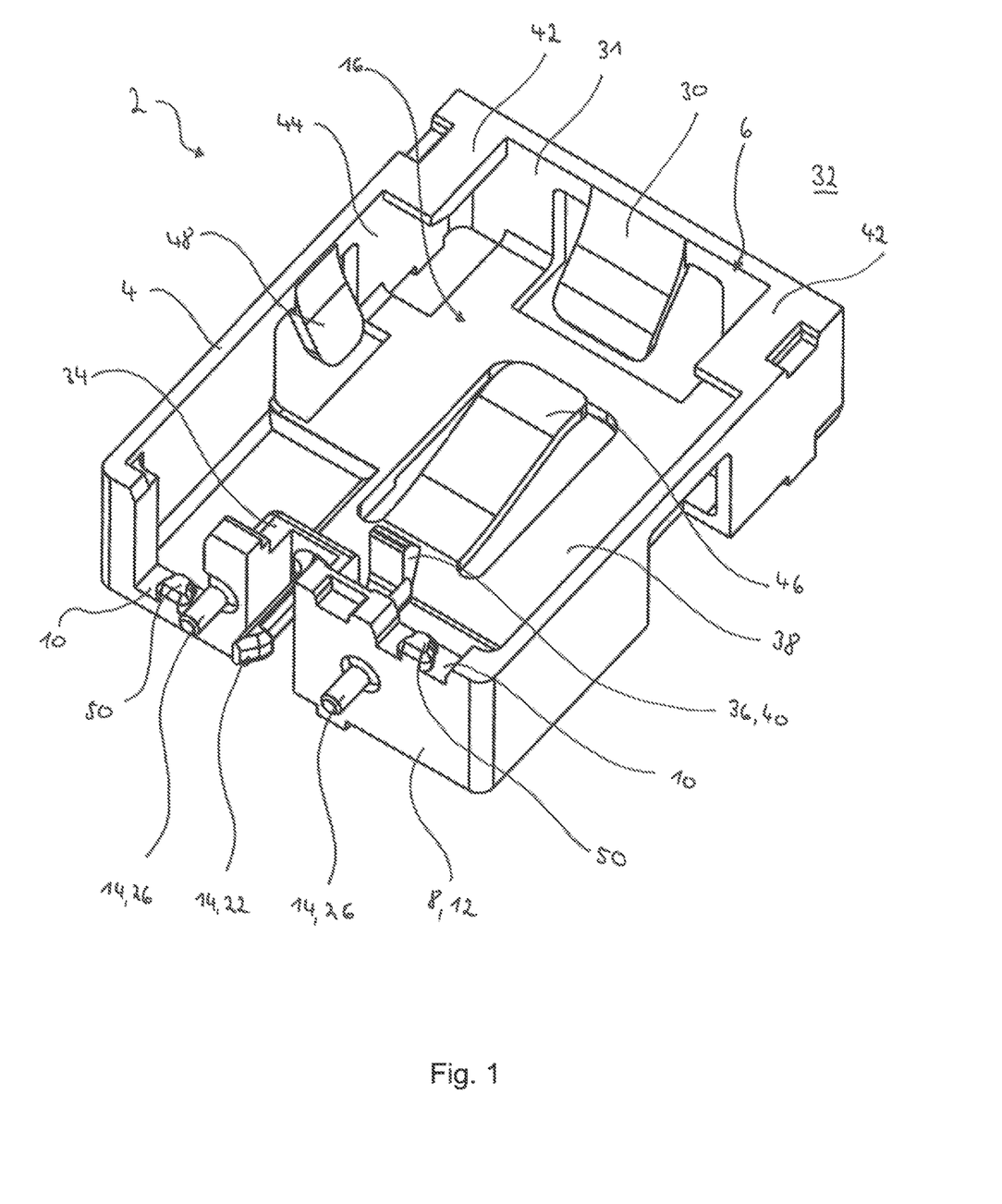
FIG. 1 is a diagrammatic, perspective view of a first variant of a formed enclosure part, having a receiving side, a mounting side and a connection side, with the receiving side adjoining the connection side and the mounting side being the connection side.

Referring now in detail to the figures of the drawings, in which parts that correspond to each other are denoted by the same reference signs, and first, particularly, to FIG. 1 thereof, there is seen a first variant of a hollow cuboidal formed enclosure part 2. The formed enclosure part 2 has a receiving side 4 having an enclosure opening 6. Adjoining the receiving side 4, running transversely in relation to the latter, is a connection side 8 that is provided with connection leadthroughs 10. Furthermore, the formed enclosure part 2 has a mounting side 12 having a mounting profile 14. The mounting side 12 of the formed enclosure part 2, according to the first variant thereof, is the connection side 8. The formed enclosure part 2 includes an enclosure interior 16 for receiving an electronic component 18 (FIG. 2), which in this case is embodied as a varistor.

Figure 3:
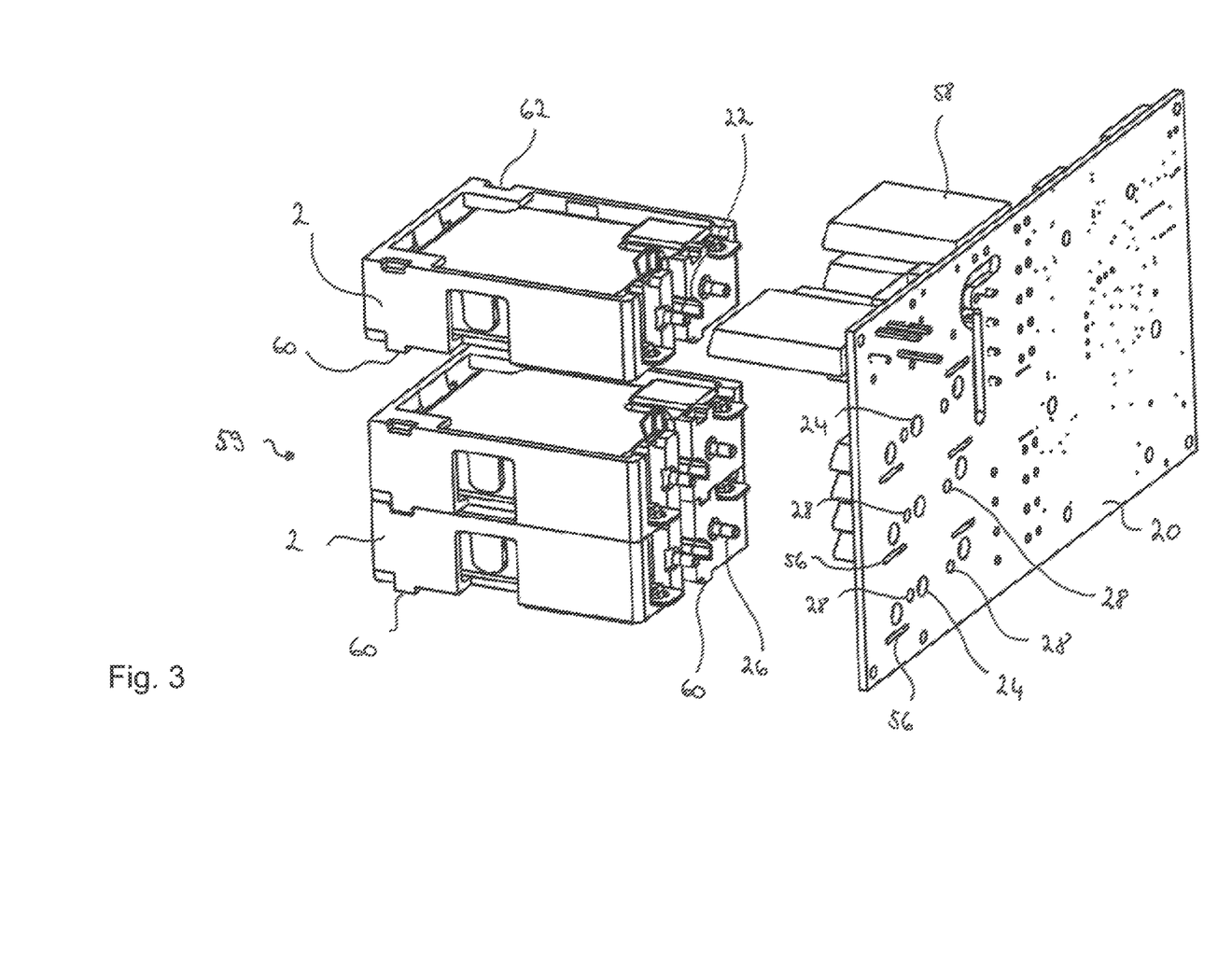
FIG. 3 is an exploded, perspective view of three formed enclosure parts according to FIG. 1, each having a joining web and a web receiver for plug-in assembly thereof with each other, and a printed circuit board on which the formed enclosure parts are in each case positioned and held by a mounting profile formed-on on the mounting side.

The mounting profile 14 formed onto the mounting side 12 has a hook-type snap-in stud 22 for the purpose of mounting the formed enclosure part 2 on a printed circuit board 20, as is represented in FIG. 3. In the course of mounting, the snap-in stud 22 is resiliently swiveled and, for the purpose of producing a snap-in connection, it is received in a corresponding snap-in receiver 24 of the printed circuit board 20. In the mounted state, the snap-in stud 22, after swiveling back, engages behind the printed circuit board 20, and thus the formed enclosure part 2 is held and positioned on the printed circuit board 20 in a form-locking manner by using plug-in mounting without the use of tools. Furthermore, the mounting profile 14 includes two joining studs 26 that, in the mounted state, are received in a corresponding stud receiver 28 (FIG. 3) of the printed circuit board 20. In summary, the formed enclosure part 2 is mounted on the printed circuit board 20 in a plug-in manner, without the use of tools, by using the two joining studs 26 and the snap-in stud 22. Moreover, due to the formed enclosure part 2 being mounted on the printed circuit board 20 at least at two points, the formed enclosure part is prevented from twisting about an axis perpendicular to the mounting side 12.

The formed enclosure part 2 has a first press lip 30, which is disposed in the region of the enclosure side that is opposite the connection side 8 and is the side referred to in the following as the top side 31. The first press lip 30 in this case is formed onto this side, and projects into the enclosure interior 16. As the electronic component 18 is being inserted, the first press lip 30 is resiliently tensioned toward an enclosure outer region 32, in such a way that a corresponding restoring force of the first press lip 30 moves (presses) the electronic component 18, inserted into the enclosure interior 16, toward the connection side 8 (FIG. 2).

Figure 2:
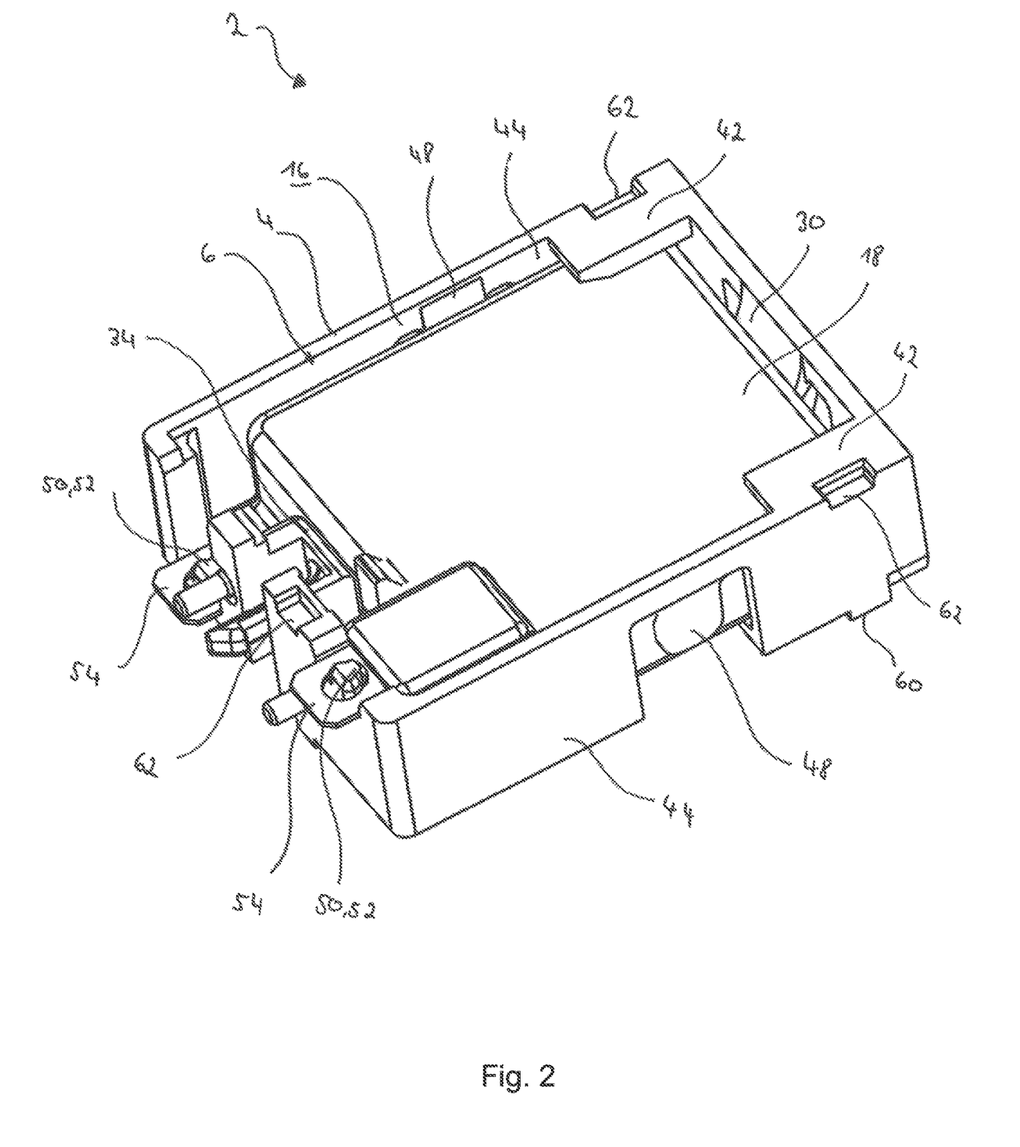
FIG. 2 is a perspective view of the formed enclosure part according to FIG. 1, having an electronic component inserted in an enclosure interior of the formed enclosure part and held in a form-locking manner therein.

As represented in FIG. 2, the electronic component 18 received into the enclosure interior 16 is additionally separably fixed by using a snap-in element 36. For this purpose, the snap-in element 36 is disposed in the region of the connection side 8, and projects into the enclosure interior 16. The snap-in element 36 extends, from an enclosure base 38 of the formed enclosure part 2 that is opposite the receiving side 4, substantially perpendicularly into the enclosure interior 16. For the purpose of mounting, the snap-in element 36 is resiliently swivelable in the direction of the connection side 8. The electronic component 18 in this case is received into the enclosure interior 16, forming a snap-in connection. In the mounted state, for this purpose a snap-in hook 40 disposed on the snap-in element 36, at its free end, engages behind the electronic component 18.

In an opening region that is opposite the connection side 8, i.e. in the region of the top side 31, the enclosure opening 6 of the formed enclosure part 2 is partially covered by two holding extensions 42. The holding extensions 42 in this case are formed-on on the side region of the top side 31 that adjoins the enclosure opening 6 and, respectively, on a longitudinal side 44 that runs transversely in relation to the top side 31 and adjoins the receiving side 4. The holding extensions 42 in this case are formed-on at the end of the corresponding side that faces away from the enclosure base 38, in other words on the side region that adjoins the enclosure opening 6. The holding extensions 42 extend, parallel to the enclosure base 38, over a corresponding corner region, in such a way that the electronic component 18 is held in the enclosure interior 16.

Further, incorporated into the enclosure base 38 is a second press lip 46, which presses the electronic component 18 against the holding extensions and against the snap-in hook 40 of the snap-in element 36. In other words, the holding extensions 42 and the snap-in hook 40 of the snap-in elements 36 act as abutments for the electronic component 18, in such a way that the electronic component 18 is fixed in the enclosure interior 16. Moreover, the two longitudinal sides 44 are each provided with a third press lip 48, which projects into the enclosure interior 16 and which fixes the electronic component 18 in the enclosure interior 16, in a direction perpendicular to the longitudinal sides 44. The third press lips 48 and the first press lip 30 in this case are formed-on, respectively, at the end of the corresponding longitudinal side 44 that faces toward the enclosure opening 6, and on the top side 31, and extend into the enclosure interior 16, toward the enclosure base 38. In the course of mounting, therefore, the third press lips 48 are already tensioned by using the insertion of the electronic component 18 into the enclosure interior 16, i.e. pretensioning of the third press lip 48 before the insertion of the electronic component 18 is not necessary. Furthermore, a region is left open around the press lips 30, 46 and 48 of the corresponding respective enclosure sides 31, 38 and 44.

According to the first variant of the formed enclosure part 2, the two connection leadthroughs 10 of the connection side 8 are each realized as a hook-type extension 50 oriented perpendicularly in relation to the enclosure base 38. A hook 52 thereof extends in the direction of the enclosure interior 16 and engages behind an electrical connection 54 of the electronic component 18 that is realized in the form of an eyelet, in such a way that the electronic component 18 is held in a form-locking manner in a direction perpendicular to the enclosure base 38. For this purpose, in the course of mounting, the eyelet-type electrical connections 54 are guided over the corresponding extensions 50. The electrical connections 54 in this case are pressed against the hook-type extension 50 by using the first press lip 30.

In summary, for the purpose of mounting, the electronic component 18 is first inserted, with its side that faces away from the electrical connections 54, into the region of the enclosure interior 16 that is covered by the holding extensions 42, in the formed enclosure part, and the first press lip 30 is tensioned toward the enclosure outer region 32. The side of the electronic component 18 that has the electrical connections 54 is then moved in the direction of the enclosure base 38, with both the second press lip 46 and the two third press lips being tensioned and the snap-in elements 36 engaging behind the electronic component 18, and the eyelet-type electrical connections 54 of the electronic component 18 being guided over the respective extensions 50. Furthermore, in particular upon a subsequent relaxation of the first press lip 30, in each case the hook 52 of the corresponding extension 50 engages behind the electrical connection 54. Thus, in summary, the electronic component 18 is held in the formed enclosure part 2 in a form-locking manner. Furthermore, in this way, the connections 54 are positioned in a comparatively precise manner toward the connection side 8, irrespective of device tolerances of the electronic component 18.

The electrical connections 54 in this case stand up from the mounting side 12. Upon mounting of the formed enclosure part 2 on the printed circuit board 20, the electrical connections 54 are received in and extend through connection receivers 56 of the printed circuit board 20, in such a way that, on the side of the printed circuit board 20 that faces away from the formed enclosure part 2 (back side of the printed circuit board), the electrical connections 54 can be electrically contacted to further electrical or electronic components 58, for example by using wave soldering (FIG. 3).

In summary, the formed enclosure part 2 is positioned and held on the printed circuit board 20, in such a way that consequently the electronic component 18 is mounted on the printed circuit board 20 by using the formed enclosure part 2.

Three formed enclosure parts 2, each having an electronic component 18 received therein, are represented in FIG. 3. The formed enclosure parts 2 are joined together in the course of a preassembly operation, to form an enclosure packet 59, in such a way that they can be fastened jointly to the printed circuit board 20. For this purpose, the formed enclosure parts 2, on the outside of the enclosure, on their enclosure base 38, each have joining webs 60 that are realized to be received in corresponding web receivers 62, of complementary geometric shape, of a further formed enclosure part 2. The receiving sides 4 of the formed enclosure parts 2 in this case are each provided with two web receivers 62 in the region of the holding extensions 42, and with a web receiver 62 in the region of the mounting side 12, with the joining webs 60 being correspondingly disposed on the outside of the enclosure, on the enclosure base 38.

Figure 4:
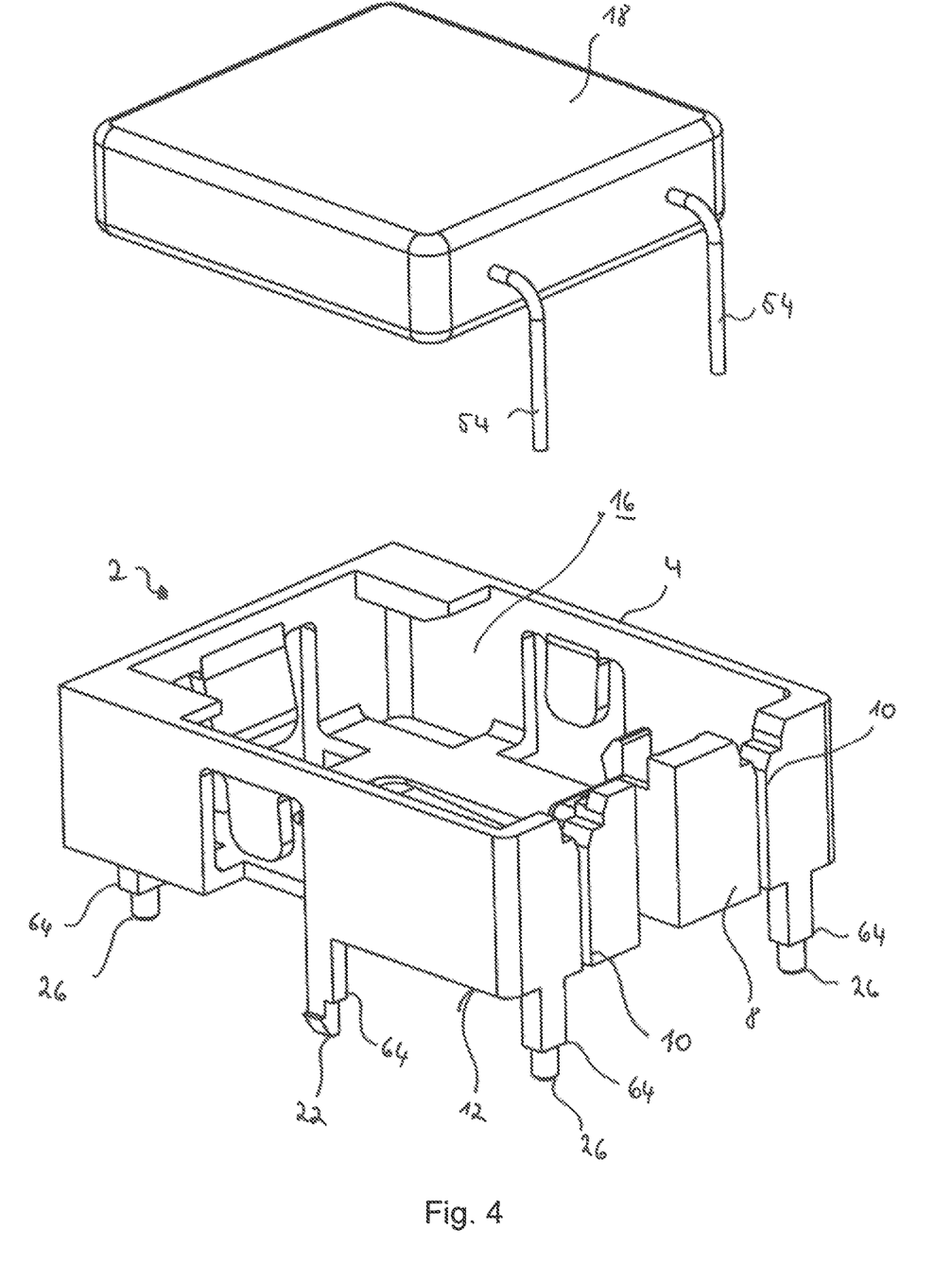
FIG. 4 is an exploded, perspective view of a second variant of the formed enclosure part and the electronic component received therein, having wire-type electronic connections, with the mounting side, in the case of the formed enclosure part, being opposite the receiving side.
Figure 5:
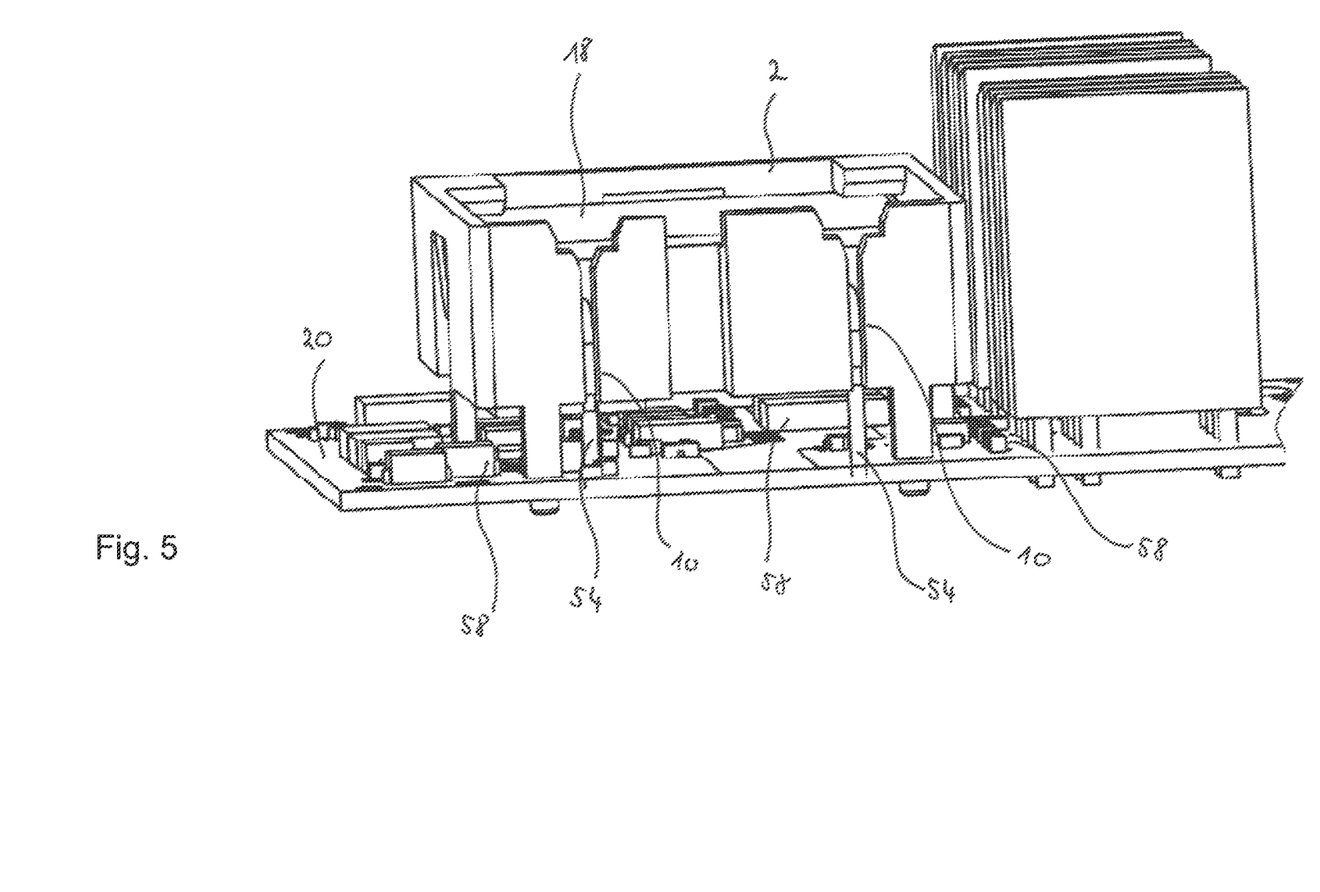
FIG. 5 is a perspective view of the formed enclosure part according to FIG. 4, with the formed enclosure part being fastened, by its mounting profile, spaced apart from the printed circuit board.

A second variant of the formed enclosure part 2 is represented in FIGS. 4 and 5. In the case of this second variant, the mounting side 12 and the receiving side 4 are opposite each other. In other words, in the mounted state the receiving side 4 is oriented parallel to the printed circuit board 20. Consequently, the connection side 8 is oriented perpendicularly in relation to the printed circuit board 20. The electronic component 18 received in the formed enclosure part 2 realized according to the second variant has wire-type electrical connections 54. The latter, for the purpose of mounting, are routed through the connection leadthroughs 10, which in this case are realized as gaps running perpendicularly in relation to the receiving side 4, and are then bent toward the printed circuit board 20, where in the course of mounting the electrical connections 54 are electrically connected, for example by soldering, to the further electrical or electronic components 58 applied to the printed circuit board 20.

In this case, the electronic component 18 is pressed, by using the first press lip, against a seating 63 formed onto the connection side 8 on the inside of the enclosure (FIG. 2), and is thus held frictionally in the enclosure interior 16.

The mounting profile 14 is realized in such a manner that, as can be seen in FIG. 5, the formed enclosure part 2 is positioned spaced apart from the printed circuit board 20. For this purpose, the joining studs 26 and the snap-in studs 22 are each provided with an abutment 64, with the abutments 64 extending from the mounting side 12 toward the free-end side of the studs 22 and 26, but not completely as far as the free-end side. In other words, the abutments 64 do not extend over the entire length of the studs 22 and 26 in a direction perpendicular to the mounting side 12, but are shaped in such a manner that the formed enclosure part 2 is held with the intended distance from the printed circuit board 20. The abutments 64 in this case are monolithic, i.e. formed integrally onto or in one piece with the joining studs 26 and onto the snap-in studs 22. Due to the abutments 64, penetration of the studs 22 and 26 into the corresponding respective receiver 24 and 28, in a direction perpendicular to the mounting side 12 of the printed circuit board 20, is limited, in such a way that, in the mounted state, the formed enclosure part 2 lies with its abutment 64 on the printed circuit board 20. In this way, in a space-saving manner, the formed enclosure part 2, in the manner of a bridge, covers further components 58 disposed on the printed circuit board 20.

Figure 6:
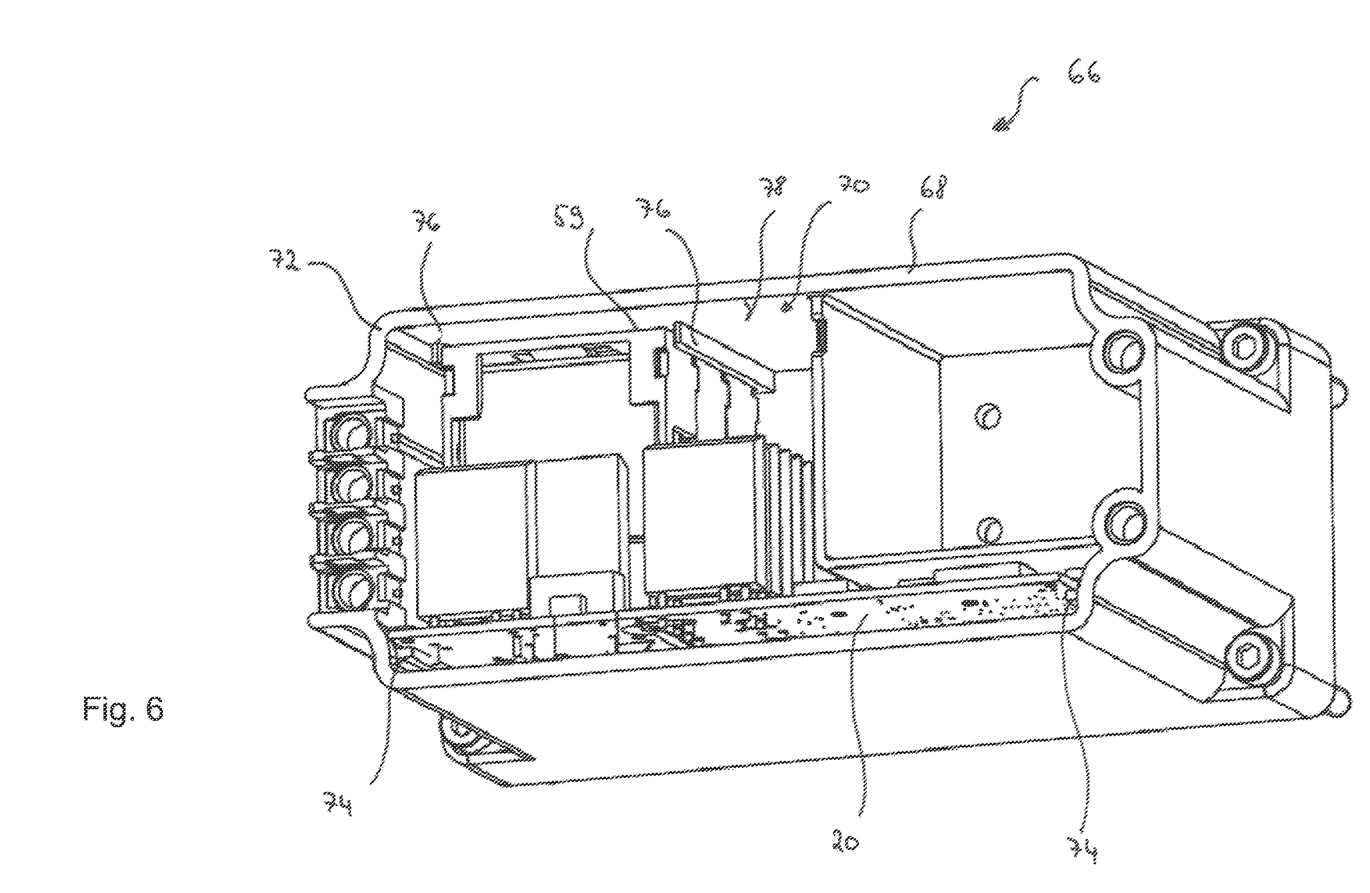
FIG. 6 is a perspective view of an electronic subassembly having a subassembly enclosure and a printed circuit board on which electronic components are mounted by using formed enclosure parts, with the subassembly enclosure having a support contour for holding the formed enclosure parts.

FIG. 6 shows an electronic subassembly 66, having a subassembly enclosure 68, a printed circuit board 20 and a plurality of formed enclosure parts 2, realized according to the first variant, which are joined together to form an enclosure packet or formed enclosure part packet 59, and in each of which an electronic component 18 is received. The formed enclosure parts 2 in this case are mounted on the printed circuit board 20. In the course of mounting the printed circuit board 20 in the subassembly enclosure 68, the printed circuit board 20, together with the formed enclosure parts 2, is inserted into the subassembly enclosure 68 through a subassembly-enclosure opening 70 of an opening side 72. In the mounted state, the printed circuit board 20 is held in the subassembly enclosure 68, perpendicularly in relation to the opening side 72, by using two holding grooves 74, with the holding grooves 74 being formed-on on two sides of the subassembly enclosure 68 that adjoin the opening side 72.

Furthermore, for the purpose of holding the enclosure packet 59 fastened to the printed circuit board 20, the subassembly enclosure 68 has a support contour 76. The support contour 76 is disposed, in the region of the enclosure packet 59, on an inner side 78 of the subassembly enclosure 68 that is oriented parallel to the printed circuit board 20. The support contour 76 is realized in the manner of a strip, and stands up in the manner of a collar from the inner side 78, on the inside of the enclosure. The support contour 76 in this case is realized substantially in a U shape, with the assigned U shape being open toward the opening side 72. In the course of mounting, the enclosure packet 59 formed by using the formed enclosure parts 2 is put into the support contour 76, with the support contour 76 acting as a guide. In the mounted state, the support contour 76 encompasses the enclosure packet 59. On the opening side, the enclosure packet 59 in the mounted state is held by a cover clip of an enclosure cover, not represented further, that closes the subassembly enclosure opening 70. The cover clip of the enclosure cover in this case extends, in the region of the formed enclosure parts 2, parallel to the inner side 78, and holds the enclosure packet 59, in a mounted state, in a direction perpendicular to the opening side 72.

In a non-illustrated alternative, a formed enclosure part 2 is inserted in an analogous manner into the subassembly enclosure 68 and held by using the support contour 76, with the formed enclosure part 2 being realized according to the second variant.

The invention is not limited to the exemplary embodiments described above. Rather, other variants of the invention may also be derived by persons skilled in the art, without departure from the subject-matter of the invention. Further, in particular, all individual features described in connection with the exemplary embodiments may also be combined with each other in any manner, without departure from the subject-matter of the invention.

The following is a summary list of reference numerals and the corresponding structure used in the above description of the invention:

LIST OF REFERENCE NUMERALS 2 formed enclosure part
4 receiving side
6 enclosure opening
8 connection side
10 connection leadthrough
12 mounting side
14 mounting profile 16 enclosure interior
18 electronic component
20 printed circuit board
22 snap-in stud
24 snap-in receiver
26 joining stud
28 stud receiver
30 first press lip
31 top side
32 enclosure outer region
36 snap-in element
38 enclosure base
40 snap-in hook
42 holding extension
44 longitudinal side
46 second press lip
48 third press lip
50 extension
52 hook
54 electrical connection
56 connection receiver
58 further components
59 enclosure packet/formed enclosure part packet
60 joining web
62 web receiver
63 seating
64 abutment
66 electronic subassembly
68 subassembly enclosure
70 subassembly enclosure opening
72 opening side
74 holding groove
76 support contour
78 inner side

The invention claimed is:

1. A formed enclosure part for mounting an electronic component on a printed circuit board, the formed enclosure part comprising:
an enclosure interior;
a receiving side having an enclosure opening for receiving the electronic component in said enclosure interior;
a connection side adjoining said receiving side and having connection leadthroughs for electrical connections of the electronic component;
a mounting side having a formed-on mounting profile for positioning and holding the formed enclosure part on the printed circuit board without using tools;
an enclosure side disposed opposite to said connection side;
a first press lip disposed in a region of said enclosure side disposed opposite to said connection side, said first press lip projecting into said enclosure interior for pressing the received electronic component toward said connection side;
an enclosure base;
a second press lip incorporated into said enclosure base;
two longitudinal sides disposed between said connection side and said enclosure side;
two third press lips each provided on a respective one of said two longitudinal sides, said two third press lips each projecting into said enclosure interior for fixing the electronic component in said enclosure interior in a direction perpendicular to said two longitudinal sides; and
said first, second and third press lips forming sets of press lips being perpendicular to each other.

2. The formed enclosure part according to claim 1, wherein said mounting profile has at least one snap-in stud for producing a snap-in connection with a corresponding snap-in receiver of the printed circuit board.

3. The formed enclosure part according to claim 1, wherein said mounting profile has at least one joining stud being received in a corresponding stud receiver of the printed circuit board in a mounted state.

4. The formed enclosure part according to claim 1, which further comprises:
a snap-in element disposed in a region of said connection side and projecting into said enclosure interior;
said snap-in element being resiliently swivelable in a direction of said connection side; and
said snap-in element having a free end with a snap-in hook for separably fixing the received electronic component in place.

5. The formed enclosure part according to claim 1, which further comprises:
at least one holding extension partially covering said enclosure opening for holding the received electronic component;
said enclosure opening having an opening region disposed opposite to said connection side; and
said at least one holding extension being disposed in said opening region of said enclosure opening.

6. The formed enclosure part according to claim 1, which further comprises:
an outside of said enclosure base; and
at least one joining web formed-on said outside of said enclosure base opposite to said receiving side;
said mounting side being identical to said connection side.

7. The formed enclosure part according to claim 6, wherein said receiving side has a web receiver configured to receive a corresponding joining web of a further formed enclosure part.

8. The formed enclosure part according to claim 6, wherein said connection leadthroughs each have a respective hook-shaped extension oriented perpendicularly to said enclosure base, and each said hook-type extension has a respective hook forming a rear engagement for an electrical connection of the electronic component.

9. The formed enclosure part according to claim 1, wherein said mounting side and said receiving side are disposed opposite to each other, and said connection leadthroughs are respective gaps running perpendicularly to said receiving side.

10. The formed enclosure part according to claim 9, wherein said mounting profile is configured for mounting the formed enclosure part spaced apart from the printed circuit board.

11. An electronic subassembly, comprising:
a subassembly enclosure receiving a printed circuit board and a formed enclosure part according to claim 1 having an electronic component disposed therein;
said formed enclosure part being mounted on the printed circuit board; and
said subassembly enclosure having an inner side and a support contour on said inner side for holding said formed enclosure part.

* * * * *